(12) United States Patent
Zang et al.

(10) Patent No.: US 10,553,698 B2
(45) Date of Patent: Feb. 4, 2020

(54) METHODS, APPARATUS AND SYSTEM FOR A SELF-ALIGNED GATE CUT ON A SEMICONDUCTOR DEVICE

(71) Applicant: GLOBALFOUNDRIES INC., Grand Cayman (KY)

(72) Inventors: Hui Zang, Guiderland, NY (US); Laertis Economikos, Wappingers Falls, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/951,621

(22) Filed: Apr. 12, 2018

(65) Prior Publication Data

US 2019/0319112 A1    Oct. 17, 2019

(51) Int. Cl.
*H01L 21/8238* (2006.01)
*H01L 29/66* (2006.01)
*H01L 27/02* (2006.01)

(52) U.S. Cl.
CPC ............ *H01L 29/66545* (2013.01); *H01L 21/823821* (2013.01); *H01L 27/0207* (2013.01)

(58) Field of Classification Search
CPC ......... H01L 29/66545; H01L 29/66795; H01L 21/823431; H01L 29/66666; H01L 29/785; H01L 21/76897; H01L 29/41791; H01L 29/4966; H01L 29/6656; H01L 29/517; H01L 29/6653; H01L 29/7851
See application file for complete search history.

(56) References Cited

U.S. PATENT DOCUMENTS 9,812,365 B1 * 11/2017 Zhang ............... H01L 29/66545
2017/0018437 A1 * 1/2017 Greene ............. H01L 29/66545
2017/0243790 A1 * 8/2017 Xie ................. H01L 21/823431

* cited by examiner

*Primary Examiner* — Robert G Bachner
(74) *Attorney, Agent, or Firm* — Williams Morgan, P.C.

(57) ABSTRACT

At least one method, apparatus and system disclosed herein involves adjusting for a misalignment of a gate cut region with respect to semiconductor processing. A plurality of fins are formed on a semiconductor substrate. A gate region is formed over a portion of the fins. The gate region comprises a first dummy gate and a second dummy gate. A gate cut region is formed over the first dummy gate. A conformal fill material is deposited into the gate cut region. At least one subsequent processing step is performed.

12 Claims, 9 Drawing Sheets

METHODS, APPARATUS AND SYSTEM FOR A SELF-ALIGNED GATE CUT ON A SEMICONDUCTOR DEVICE

BACKGROUND OF THE INVENTION

Field of the Invention

Generally, the present disclosure relates to the manufacture of sophisticated semiconductor devices, and more specifically, to performing a gate cut process for a finFET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one of various techniques, a plurality of fins are formed on substrate. A plurality of layers of materials that may be deposited on the fins. Some of the fins are designated to be source or drain fins, while a gate area is formed above the fins between the source and drain regions. In the gate area, dummy gate regions are formed over the fins. In a predetermined location, a gate cut is performed to create dielectric regions for providing electrical isolation between two gate metal regions. In some cases, a deviation from the intended target location for the gate cut region may occur. This may cause an inadvertent extraction of material from a region outside of the intended gate cut region. This may cause process material to be extracted from and/or deposited into regions outside the gate cut region. These unintended consequences may result in device errors and/or device degradation, negatively affecting performance and/or yields.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for adjusting for a misalignment of a gate cut region with respect to semiconductor processing. A plurality of fins are formed on a semiconductor substrate. A gate region is formed over a portion of the fins. The gate region comprises a first dummy gate and a second dummy gate. A gate cut region is formed over the first dummy gate. A conformal fill material is deposited into the gate cut region. At least one subsequent processing step is performed.

BRIEF DESCRIPTION OF THE DRAWINGS

The disclosure may be understood by reference to the following description taken in conjunction with the accompanying drawings, in which like reference numerals identify like elements, and in which.

Figure 1:
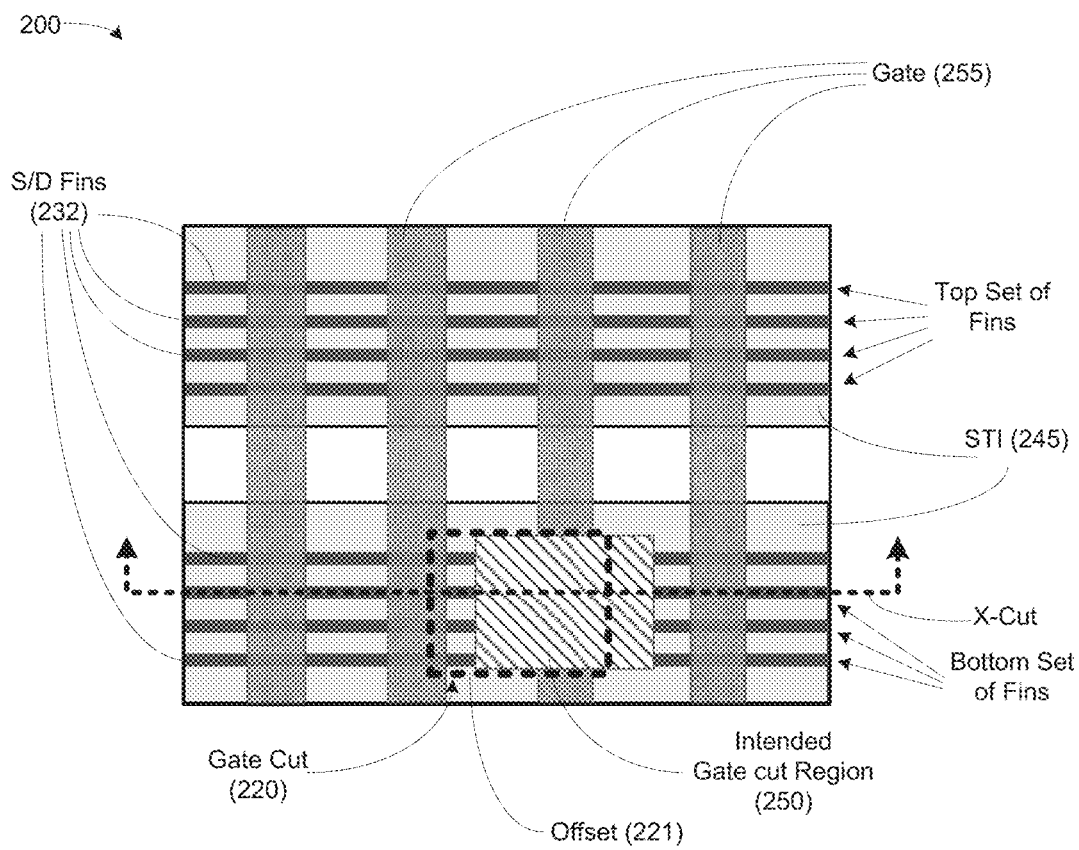
FIG. 1 illustrates a stylized, simplified plan view of a finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming a gate cut region for providing an electrical isolation between two gate-metal regions. Embodiments herein provide for performing a gate cut in a predetermined gate cut region, wherein a fill material is deposited into the gate cut region. Any offset of the gate cut from the predetermined gate cut location may form a misaligned gate cut region. In some cases, this may expose a portion of a dummy gate that was not intended to be part of the gate cut region. The fill material may be deposited into the offset gate cut region, followed by an etch back process and other subsequent processes, such as dummy gate removal and replacement metal gate (RMG) processes. In this manner, embodiments provide for filling in the offset cut region and performing subsequent processes to reduce or negate at least some or substantially all of the adverse effects of an unintended offset or misalignment of the gate cut process. This provides for the gate cut process being a self-aligned process.

Turning now to FIG. 1, a stylized, simplified top view of a finFET device is illustrated. FIG. 1 illustrates an integrated circuit device 200 comprising a plurality of fins 232 formed on a shallow isolation trench 245, which is formed on a substrate 210 (not visible in the top view of FIG. 1). In some embodiment, the top portion of the set of fins may be NFET fins and the bottom set of the fins may be PFET fins. Further, FIG. 1 illustrates a plurality of gates formations 255 formed on a portion of the S/D fins 232. The gate formations 255 at this stage of processing may be formed of poly-silicon material, i.e., formed as dummy gates. In some embodiments, the device 200 may include an amorphous silicon (a-Si) formation in an oxide layer, as part of the gate formations.

Within some of the gates formations 255, one or more gate cuts 220 may be formed for creating gate cut regions. FIG. 1 illustrates an exemplary intended gate cut region 250. This intended gate cut region 250 may be formed for providing a dielectric region for creating a metal to metal isolation. However, in some processes, an offset of the intended gate cut 250 may occur, resulting in the exemplary gate cut region illustrated by the dotted-line rectangle 221. This may result in an offset or misaligned gate cut region, which is undesirable.

FIG. 1 also shows an X-cut line provided for reference with respect to a cross-sectional view shown in subsequent figures. FIGS. 2-9 represent stylized cross-sectional views of finFET devices with respect to the X-cut line, in accordance with exemplary embodiments herein. Those skilled in the art would appreciate that the gate cut regions of FIG. 1 is provided for exemplary and illustrative purposes and that other gate cut regions may be formed on the device 200.

Figure 2:
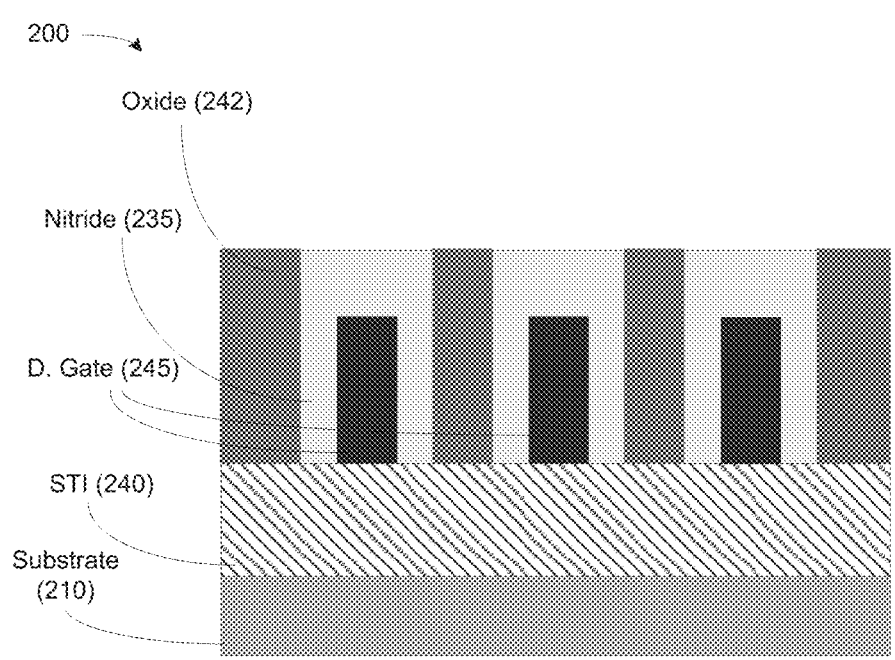
FIG. 2 illustrates a stylized depiction of a cross-sectional view across a plurality of gate regions and over fins, in accordance with embodiments herein.

Turning now to FIG. 2, illustrates a stylized depiction of a cross-sectional view across a plurality of gate regions over fins, in accordance with embodiments herein. The device 200 comprises a substrate 210 on which the STI feature 240 and gate regions 255 are formed. The gate region 255 may be formed over a portion of fins. In some embodiments, a portion of the substrate 210 and STI feature 240 may be a part of fins (e.g., the fins 232 shown in FIG. 1).

Continuing referring to FIG. 2, the gate region 255 includes a plurality of gate features that each include a dummy gate or poly gate region 245, which may be formed from using a poly gate material (e.g., polysilicon, amorphous silicon (a-Si), etc.). Each of the dummy gates 245 may be encompassed by a nitride feature 235, which may be surrounded by an oxide region 242.

Figure 3:
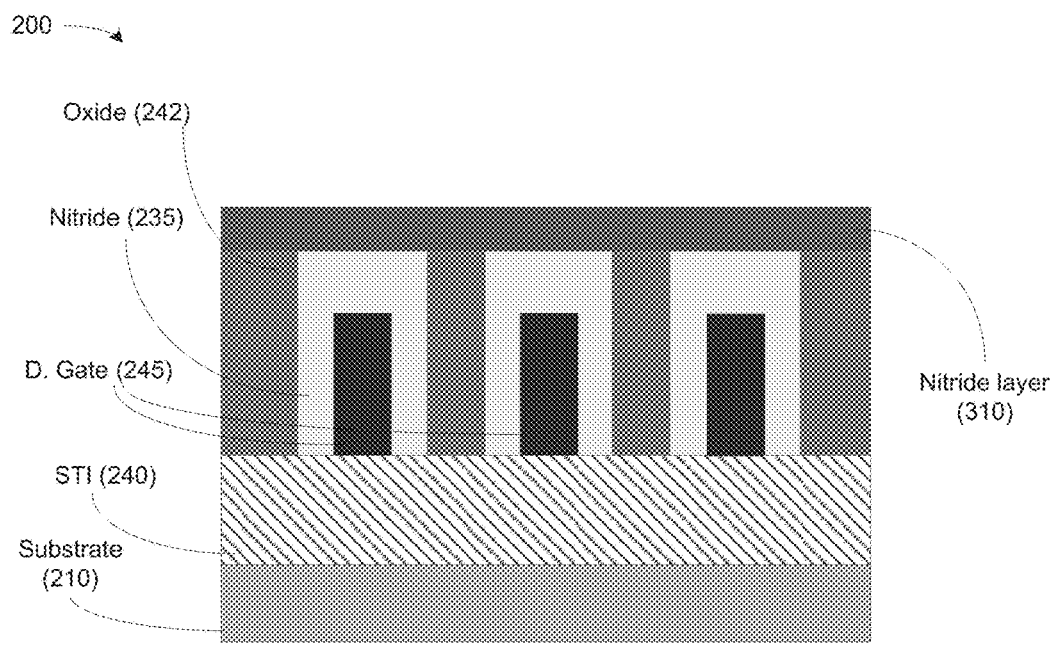
FIG. 3 illustrates a stylized depiction of the device of FIG. 2 with respect to a nitride layer deposition process, in accordance with embodiments herein.

FIG. 3 illustrates a stylized depiction of the device 200 with respect to a nitride layer deposition process in accordance with embodiments herein. In one embodiment, a layer 310 of nitride material (e.g., SiN) may be deposited above the gate regions. Those skilled in the art would appreciate that other processes, such as development of source/drain (S/D) regions, epitaxial regions on the S/D regions, etc. may be also performed. The nitride layer 310 encompasses a plurality of dummy gates 245, including the gate region where a gate cut may be formed for creating an isolation region between two gates.

Figure 4:
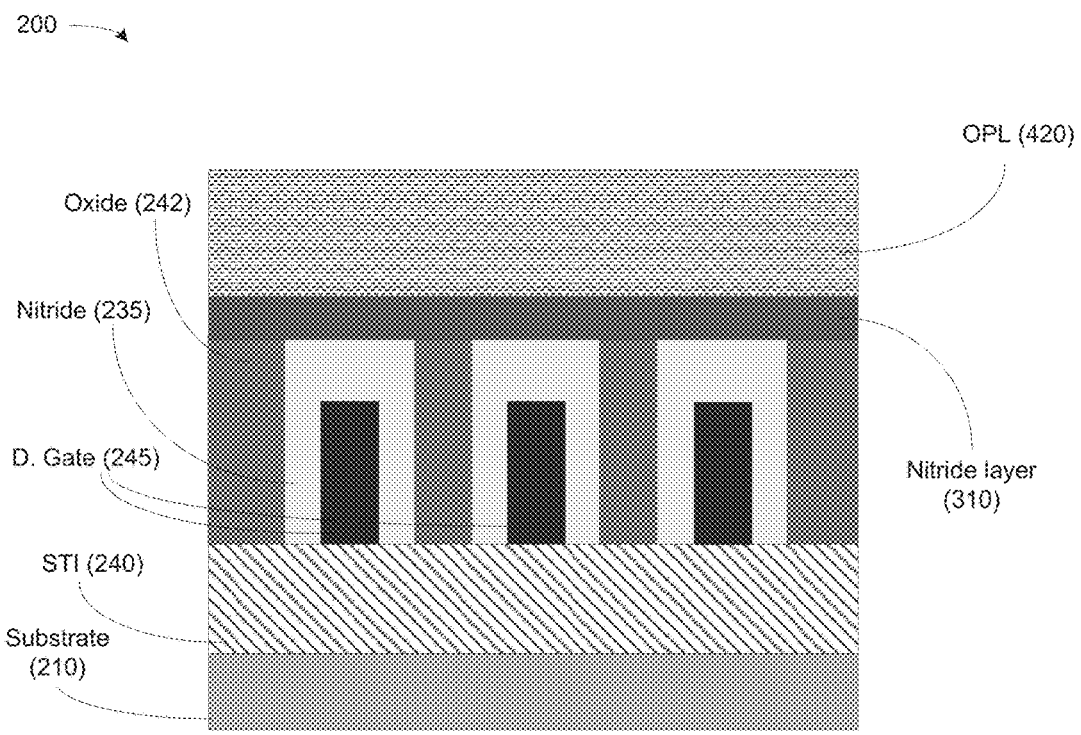
FIG. 4 illustrates a stylized depiction of the device of FIG. 2 with respect to an OPL deposition process, in accordance with embodiments herein.

FIG. 4 illustrates a stylized depiction of the device of FIG. 2 with respect to an OPL deposition process in accordance with embodiments herein. Upon depositing the nitride layer 310, a layer of organic planarization layer (OPL) 410 may be deposited on the device 200, above the nitride layer 310. The OPL 410 deposition may be performed using a spin-coating process, followed by a drying process. In some embodiments the OPL 410 may include a spin-on carbon material. In some embodiments, the thickness of the OPL may be in the range of about 100 nm to about 900 nm.

Figure 5:
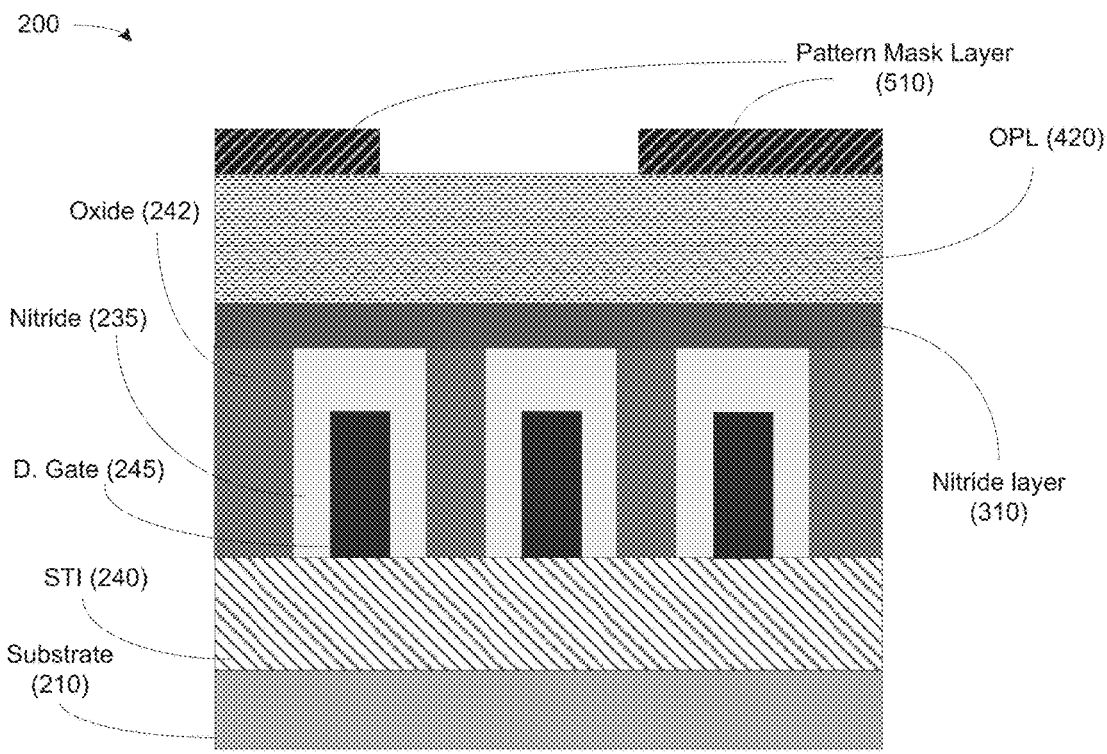
FIG. 5 illustrates a stylized depiction of the device of FIG. 2 with respect to pattern mask deposition process, in accordance with embodiments herein.

FIG. 5 illustrates a stylized depiction of the device of FIG. 2 with respect to pattern mask deposition process, in accordance with embodiments herein. Upon forming the OPL 410, a patterning mask layer 510 may be formed over the OPL. The mask layer 510 may be formed such that the OPL layer is protected about gate regions that are not be cut. That is, the mask layer 510 leaves exposed the area for a gate cut process to be implemented. The mask layer 510, for example, may be a photoresist coating.

Figure 6:
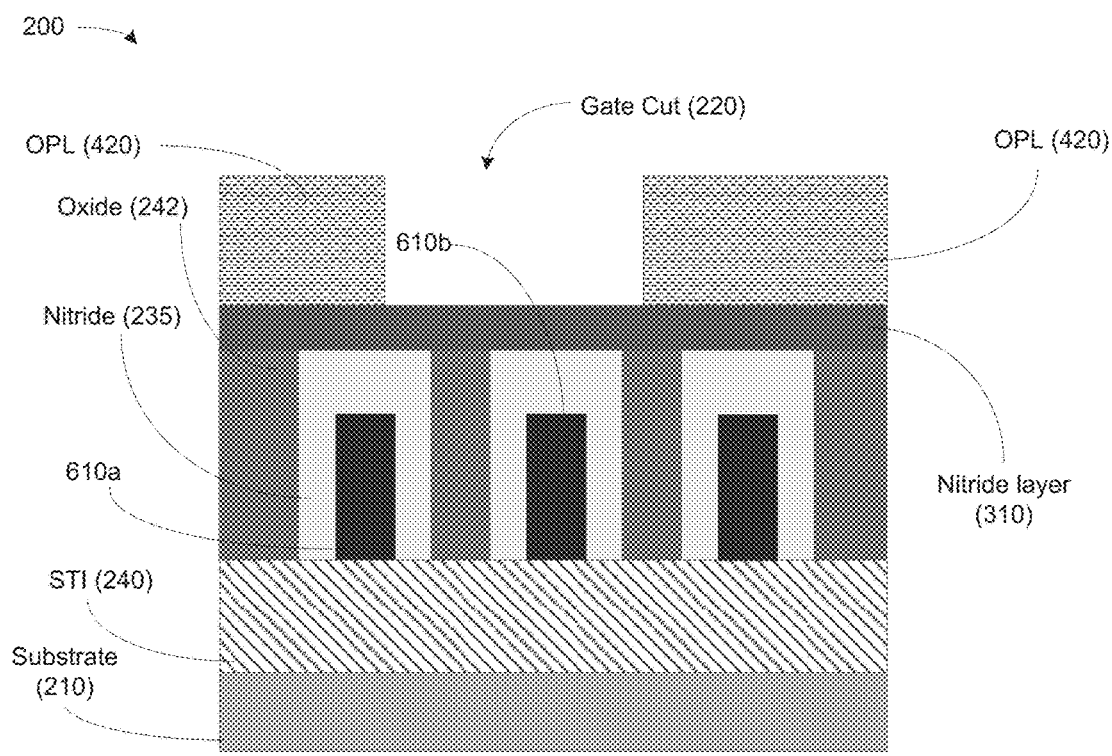
FIG. 6 illustrates a stylized depiction of the device of FIG. 2 with respect to a gate cut patterning process, in accordance with embodiments herein.

FIG. 6 illustrates a stylized depiction of the device of FIG. 2 with respect to a gate cut patterning process, in accordance with embodiments herein. An etch process may be performed to remove the portion of the OPL 410 in which a gate cut region is to be formed. In one embodiment, a photolithography process is performed to expose the region for the gate cut 220 (i.e., not protected by the pattern mask layer 510, as shown in FIG. 6. This process exposes the nitride layer 310 in the gate cut region 220. Further, the pattern mask layer 510 of FIG. 5 is removed after the gate cut 220 pattern is formed in the OPL 420.

The gate cut 220 illustrated in FIGS. 5-6 show that there is a slight exemplary misalignment. That is, the gate cut 220, intended to provide an opening to the center gate 610b, also would provide a partial opening to the gate 610a, which is undesirable.

Figure 7:
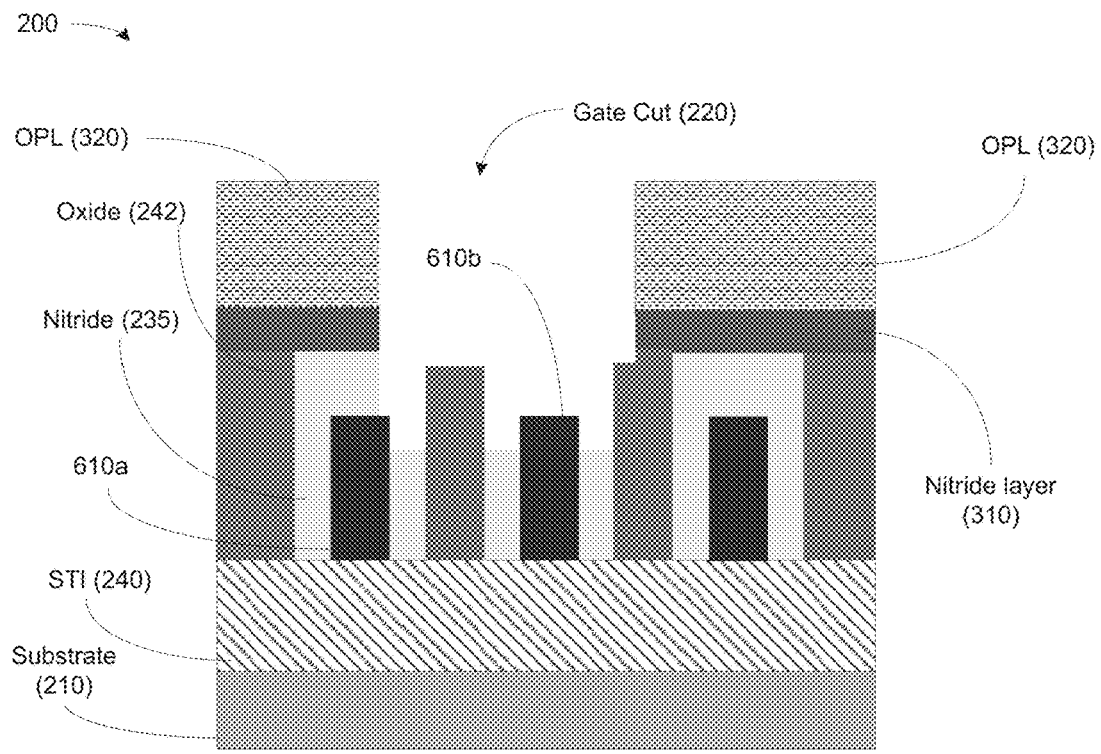
FIG. 7 illustrates a stylized depiction of the device of FIG. 2 with respect to a selective nitride etch process, in accordance with embodiments herein.

FIG. 7 illustrates a stylized depiction of the device of FIG. 2 with respect to a selective nitride etch process, in accordance with embodiments herein. A selective nitride etch process is performed in the gate cut 220 region. This opens a portion of the nitride layer 310, as well as the nitride features 235, in the gate cut 220 region. Due to the offset or misalignment of the gate cut 220, a portion of the gate 610a is exposed, which would be an unintended result.

Figure 8:
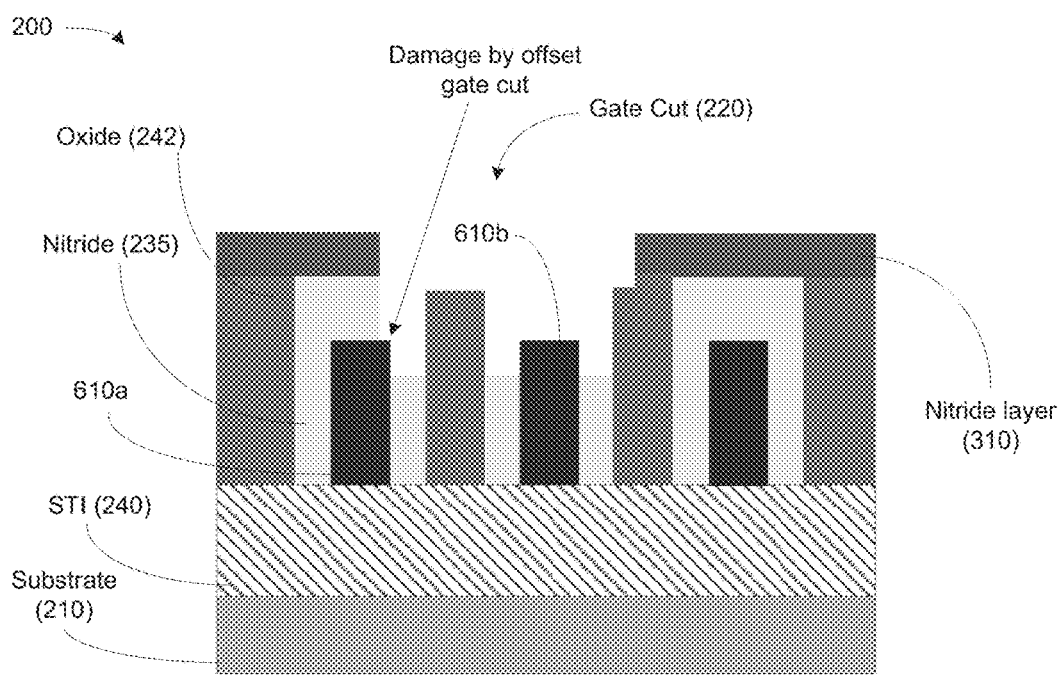
FIG. 8 illustrates a stylized depiction of the device of FIG. 2 with respect to a OPL removal process, in accordance with embodiments herein.

FIG. 8 illustrates a stylized depiction of the device of FIG. 2 with respect to an OPL removal process, in accordance with embodiments herein. The OPL 320 is removed from above the nitride layer 310. The exposed portion of the gate 610a, which was exposed due to the offset of the gate cut 220, may cause damage to the device 200 as a result of subsequent processing of the device 200.

Figure 9:
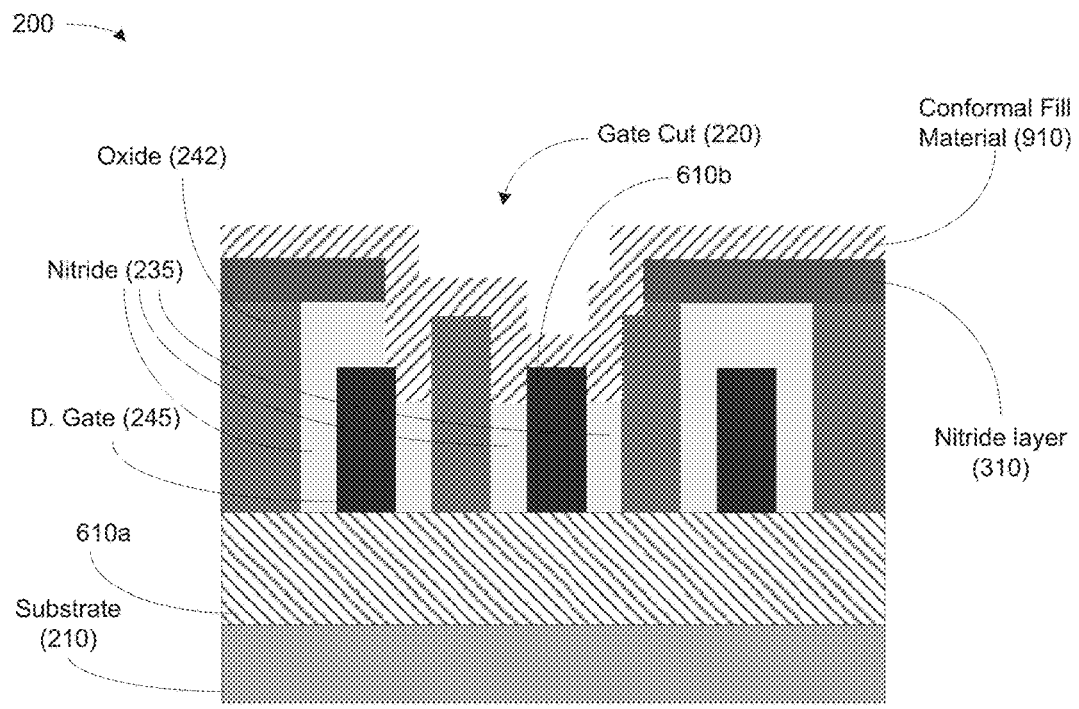
FIG. 9 illustrates a stylized depiction of the device of FIG. 2 with respect to a conformal fill material deposition process, in accordance with embodiments herein.

FIG. 9 illustrates a stylized depiction of the device of FIG. 2 with respect to a conformal fill material deposition process, in accordance with embodiments herein. A conformal fill material 910 may be deposited into the gate cut 220 region. The conformal fill material 910 may be one of a plurality of dielectric materials, such as conformal nitride material (e.g., conformal SiN), a low-K dielectric material, etc. The deposition of the conformal fill material 910 covers the area of the region of the gate 610b intended for the gate cut, as well as the exposed portion of the gate 610a, which was not intended for the gate cut.

Figure 10:
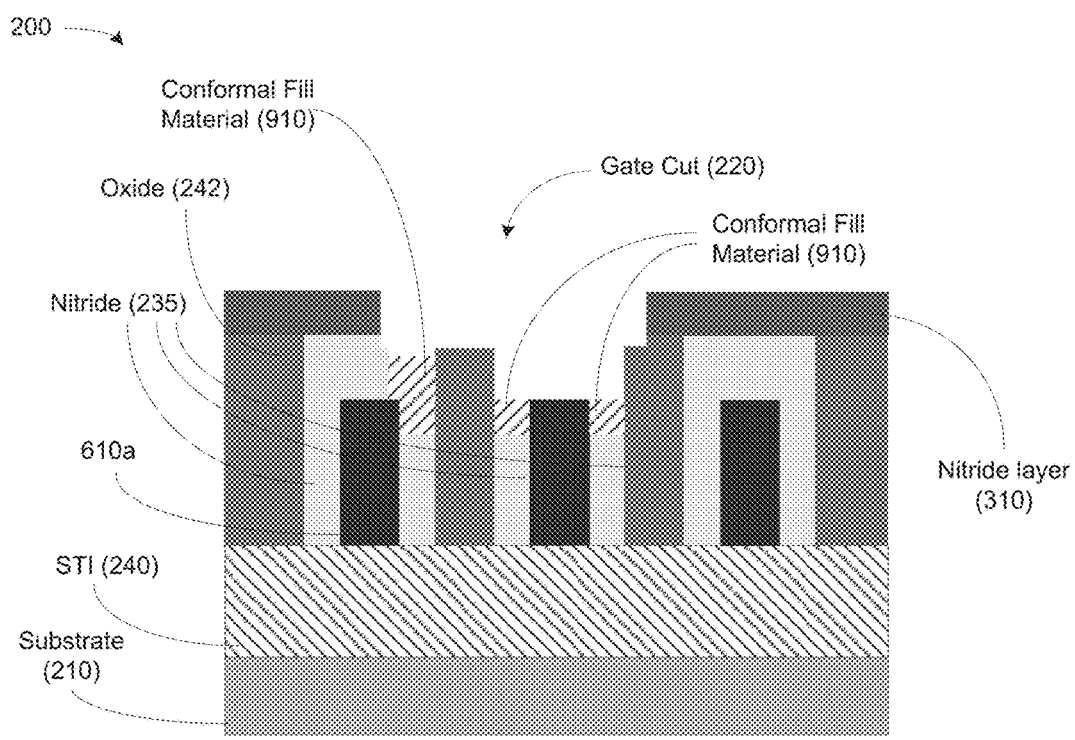
FIG. 10 illustrates a stylized depiction of the device of FIG. 2 with respect to a conformal fill material etch back process, in accordance with embodiments herein.

FIG. 10 illustrates a stylized depiction of the device of FIG. 2 with respect to a conformal fill material etch back process, in accordance with embodiments herein. A portion of the conformal fill material 910 is etched back below the level of the nitride layer 310, as shown in FIG. 10. In one embodiment, the conformal fill material 910 is etched back to the level of intended gate cut region (i.e., at gate 610b), but above the level of the unintended gate cut region (i.e., at gate 610a).

In one embodiment, the conformal fill material 910 etch back process may be performed using an isotropic nitride etch back process. In another embodiment, a reactive ion etch (RIE) process may be performed to etch back the conformal fill material 910. In yet another embodiment, if a sufficiently controlled wet etch process is possible, a wet etch process may be performed to etch back the conformal fill material 910.

Figure 11:
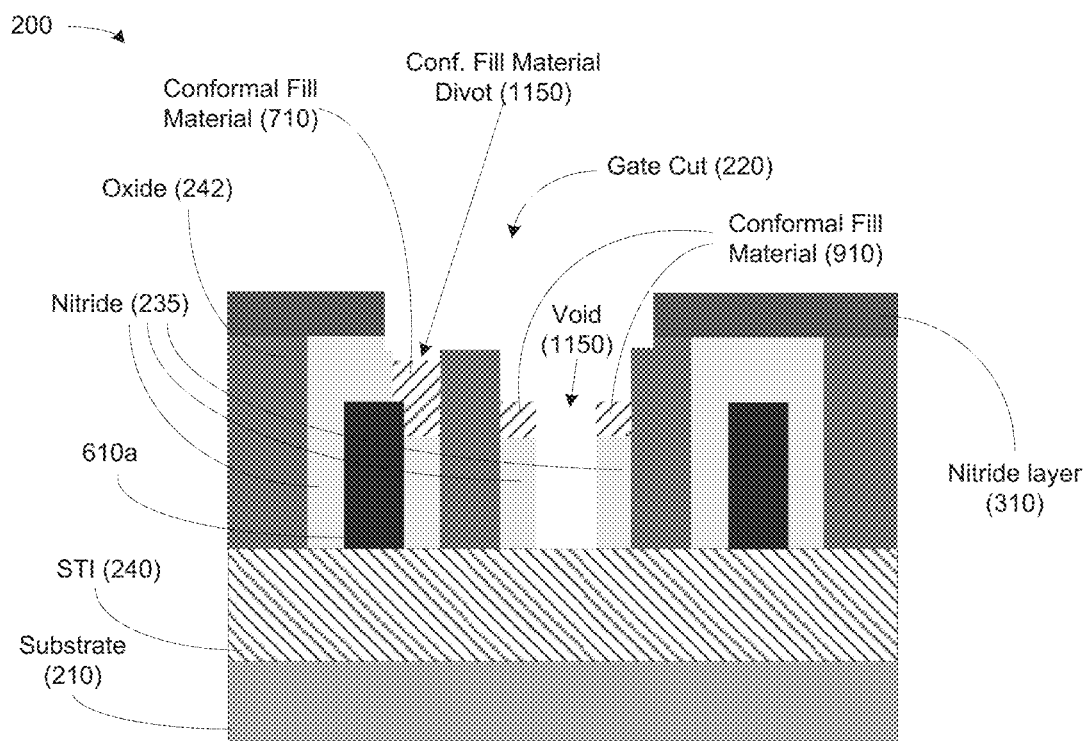
FIG. 11 illustrates a stylized depiction of the device of FIG. 2 with respect to a dummy gate removal process, in accordance with embodiments herein.

FIG. 11 illustrates a stylized depiction of the device of FIG. 2 with respect to a dummy gate removal process, in accordance with embodiments herein. The dummy gate 610b is removed prior to performing subsequent processes, such as a replacement metal gate (RMG) process.

The removal of the dummy gate may be performed in a conventional process known to those skilled in the art having benefit of the present disclosure. The removal of the dummy gate does not disturb the conformal fill material 910 features, as shown in FIG. 11. This leaves a portion of the conformal fill material 910 adjacent and above the unintentionally exposed dummy gate 610a, as well as a portion on each side of the void 1150 left after removal of the intended exposed dummy gate 610b. Subsequent processes, such as an RMG process may be performed on the device 200.

Figure 12:
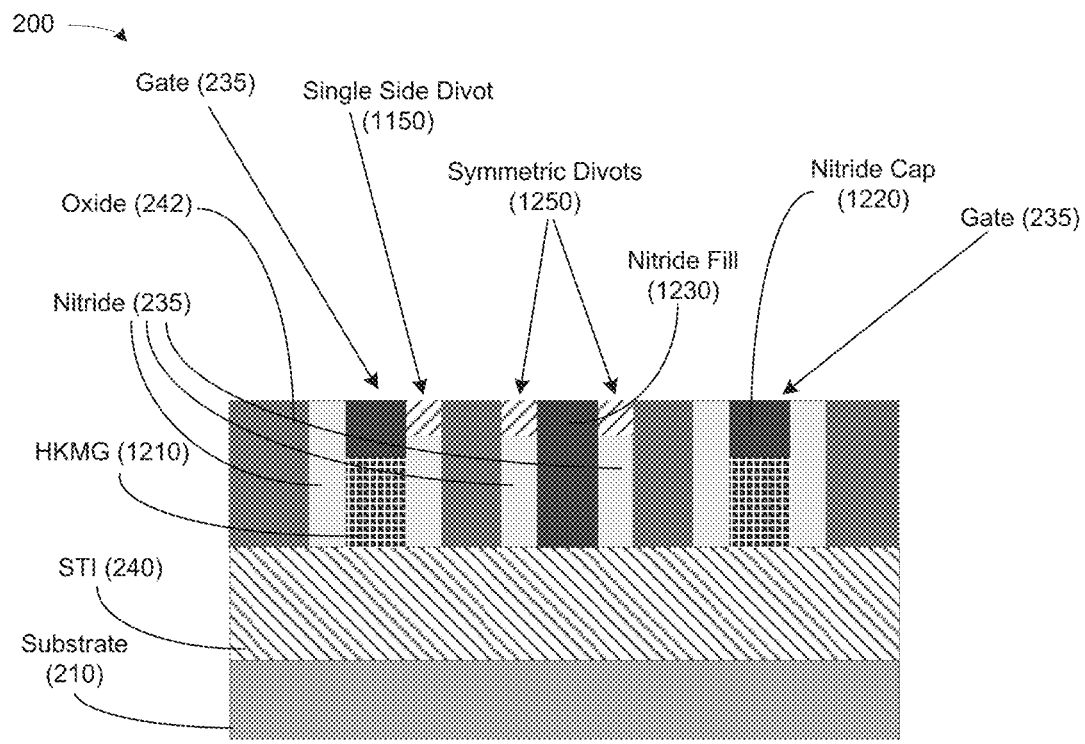
FIG. 12 illustrates a stylized depiction of the device of FIG. 2 after performing an RMG process, in accordance with embodiments herein.

FIG. 12 illustrates a stylized depiction of the device of FIG. 2 after performing an RMG process, in accordance with embodiments herein. An RMG process may be performed on the device 200, replacing the dummy gate material with a gate metal 1210, e.g., high-K metal gate (HKMG) material. This process may also include depositing a work function metal (WFM) layer. A nitride cap 1220 (e.g., formed from SiN) remains above the HKMG features 1210.

Further, the void 1150 left from removing the dummy gate 610b may be filled with a nitride material (e.g., SiN), forming a nitride fill feature 1230. The device 200 also comprises a single side divot 1150 or cap feature. The divot 1150 or cap feature is formed from the conformal fill material 910) above the unintentionally exposed gate region. Moreover, two symmetric divots 1250 (or cap features) formed from the conformal fill material 910 may remain symmetrically on either side of the nitride fill feature 1230. This provides a self-aligned gate cut feature over the intended gate formation/region. Subsequent processing known to those skilled in the art having benefit of the present disclosure may be performed to complete forming the device 200.

Figure 13:
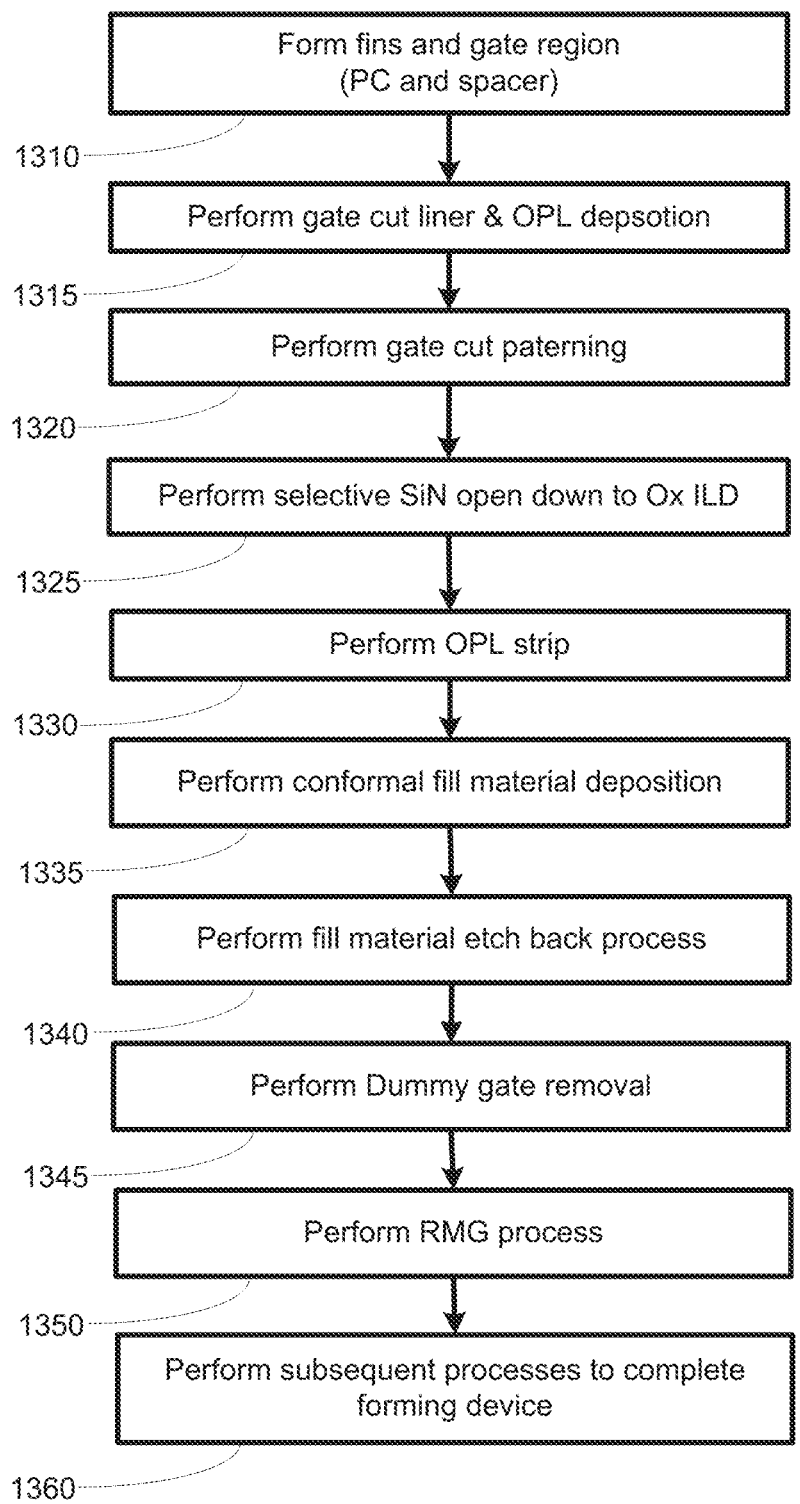
FIG. 13 illustrates a flowchart depiction of a method for manufacturing a device, in accordance with one embodiment herein, is illustrated.
Figure 14:
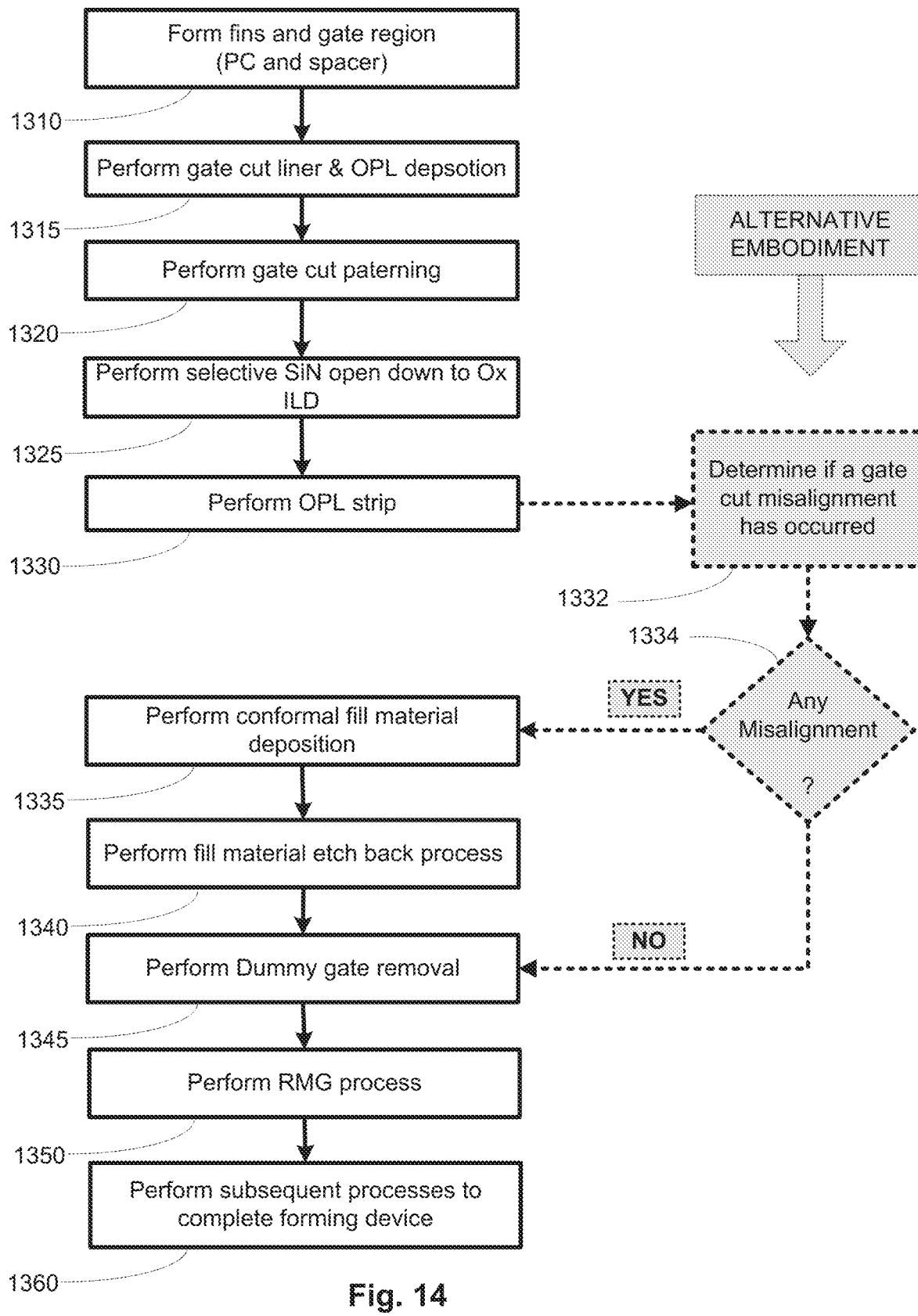
FIG. 14 illustrates a flowchart depiction of a method for manufacturing a device, in accordance with an alternative embodiment herein, is illustrated.

FIG. 13 illustrates a flowchart depiction of a method for manufacturing a device, in accordance with one embodiment herein, is illustrated. FIG. 14 illustrates a flowchart depiction of a method for manufacturing a device, in accordance with an alternative embodiment herein, is illustrated. Referring simultaneously to FIGS. 13 and 14, a plurality of fins, including PFET and NFET fins, as well as one or more gate regions are formed on a substrate layer (at 1310). The gate regions may be formed on a portion of the fins, as exemplified in FIG. 1. Those skilled in the art would appreciate that forming the gate region comprises various process steps, such as forming gate space region, poly gate region, nitride liner, low-k spacer, oxide liner, etc. (see for example, FIG. 2). Those skilled in the art would appreciate that further processes to form transistor devices (e.g., forming EPI features, inter-layer dielectric (ILD) deposition process, performing S/D contact regions, etc.) may be performed.

A gate cut liner and OPL deposition processes may be performed (at 1315), as exemplified in FIGS. 3-4. A nitride liner may be formed, on which an OPL layer is formed. Subsequently, a gate cut patterning process may be performed (at 1320), see e.g., FIG. 5-6. This process may comprise forming a pattern mask layer with an opening for a gate cut region. An etch process may be performed to remove a portion of the OPL layer that was not protected by the pattern mask layer. In some cases, a shift of the intended gate cut region may occur, wherein embodiment herein provide for performing process steps to reduce or negate the effect of such misalignment.

Subsequently, a selective nitride removal process may be performed to remove nitride features, down to the oxide ILD material (at 1325), see e.g., FIG. 7). In the event that there is a misalignment of the gate cut, an unintended exposure of a portion of a dummy gate outside the gate cut region may occur. Further, an OPL strip process may be performed to remove the OPL feature (at 1330), see e.g., FIG. 8.

In one embodiment (FIG. 13), a conformal fill material deposition process may be performed (at 1335), see e.g., FIG. 9. In an alternative embodiment (FIG. 14), a determination may be made if a gate cut misalignment has occurred (at 1332). If a determination is made whether a gate cut misalignment had been detected (at 1334), the step of deposition of the conformal fill material is performed (at 1335). The conformal fill material may be one of a plurality of conformal materials, e.g., SiN, low-K dielectric, etc.

Continuing referring to FIGS. 13 and 14, a conformal fill material etch back process is performed (at 1340), see e.g., FIG. 10. This process may be performed by using an isotropic SiN removal process, an RIE process, or a wet etch process having sufficient control. This process covers the exposed portion of the dummy gate that was unintentionally exposed during the gate cut process.

Subsequently, a dummy gate removal process is performed for removing the dummy gate in the gate cut region (at 1345), see e.g., FIG. 11. In the alternative embodiment of FIG. 14, upon determining that a misalignment in the gate cut has not occurred, after performing the OPL strip process, the process of removing the dummy gate in the gate cut region is performed.

Subsequently, and RMG process is performed (at 1350), see e.g., FIG. 12. The void left from removing the dummy gate in the gate cut region is filled with a dielectric material (e.g., SiN fill material), providing a dielectric buffer between two active gates. Upon performing the RMG process, a side divot made of the conformal fill material is left adjacent and above the HKMG of the dummy gate that was unintendedly exposed outside of the intended gate cut region. Further, two symmetric divots made of the conformal fill material are left on either side of the void that was filled in after removal of the dummy gate in the gate cut region. This provides a self-aligned gate cut feature over the intended gate formation/region.

Further processes for completing processing/manufacturing of the finFET device 200 may be performed (at 1360). Using principles described herein, those skilled in the art having benefit of the present disclosure would appreciate that the processes described in FIGS. 2-12 may be performed for PMOS devices and for NMOS devices. Further processing may be performed to complete forming the transistor device in accordance with embodiments herein.

Figure 15:
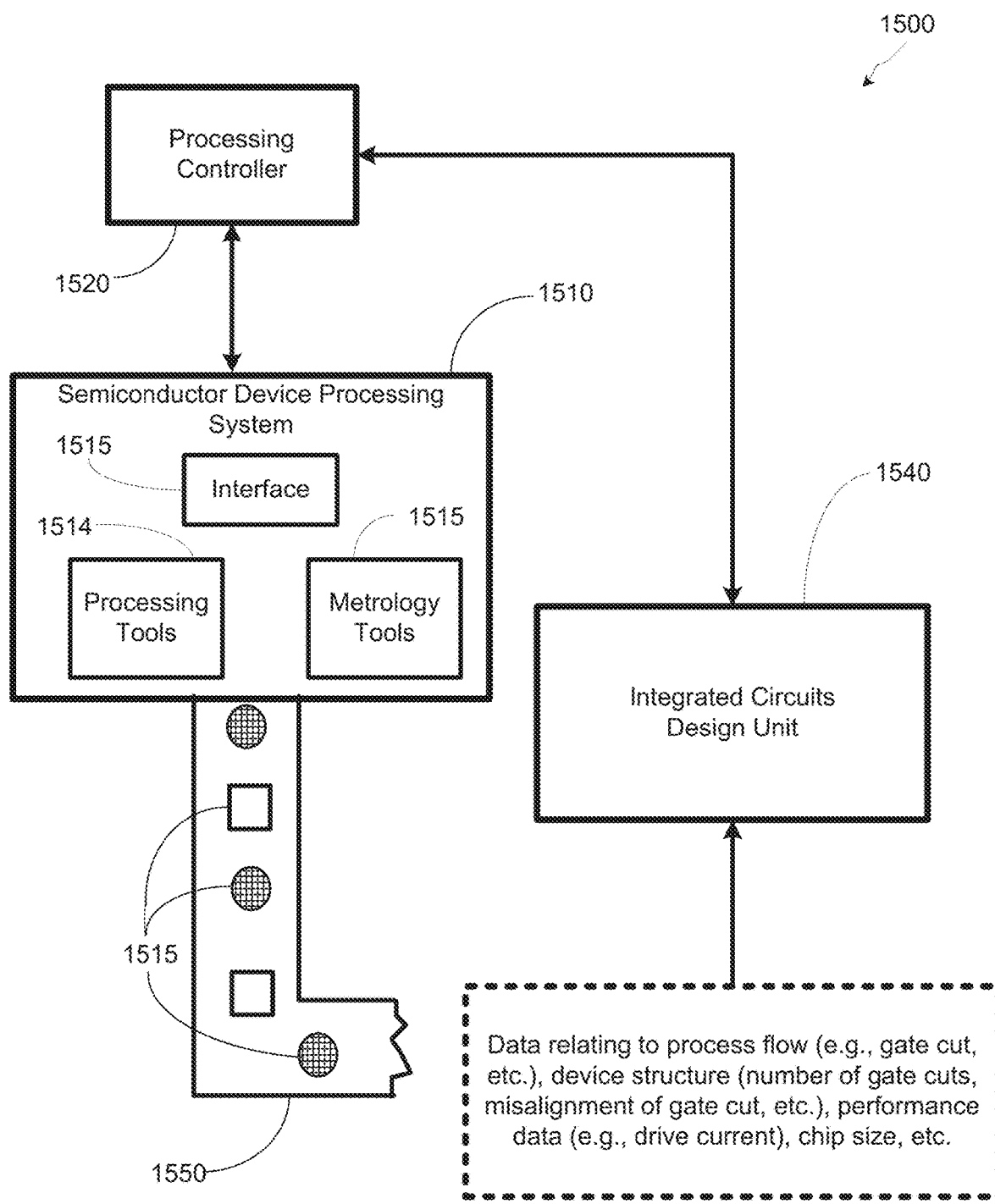
FIG. 15 illustrates a stylized depiction of a system for fabricating a semiconductor device comprising an integrated circuit, in accordance with embodiments herein.

Turning now to FIG. 15, a stylized depiction of a system for fabricating a semiconductor device comprising an integrated circuit, in accordance with embodiments herein, is illustrated. The system 1500 provides for performing a gate cut and forming a conformal fill material feature for addressing a possible exposure of a dummy gate outside of the gate cut region that may be unintentionally exposed.

The system 1500 of FIG. 15 may comprise a semiconductor device processing system 1510 and a design unit 1540. The semiconductor device processing system 1510 may manufacture integrated circuit devices based upon one or more designs provided by the design unit 154.

The semiconductor device processing system 1510 may comprise various processing stations, such as etch process stations, photolithography process stations, oxide deposition process stations, CMP process stations, Epitaxy (EPI) process stations, etc. One or more of the processing steps performed by the processing system 1510 may be controlled by the processing controller 1520. The processing controller 1520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1510 may produce integrated circuits on a medium, such as silicon wafers. More particularly, the semiconductor device processing system 1510 produce integrated circuits having finFET devices that comprise TS trench formations having reduced or substantially eliminated residue at the bottom portion of the trench, as described above.

The production of integrated circuits by the device processing system 1510 may be based upon the circuit designs provided by the integrated circuits design unit 1540. The processing system 1510 may provide processed integrated circuits/devices 1515 on a transport mechanism 1550, such as a conveyor system. In some embodiments, the conveyor system may be sophisticated clean room transport systems that are capable of transporting semiconductor wafers. In one embodiment, the semiconductor device processing system 1510 may comprise a plurality of processing steps to perform sigma recess regions, filling them with an REO material, and forming EPI features on the REO material, as described above.

In some embodiments, the items labeled "1515" may represent individual wafers, and in other embodiments, the items 1515 may represent a group of semiconductor wafers, e.g., a "lot" of semiconductor wafers. The integrated circuit or device 1515 may be a transistor, a capacitor, a resistor, a memory cell, a processor, and/or the like.

The integrated circuit design unit 1540 of the system 1500 is capable of providing a circuit design that may be manufactured by the semiconductor processing system 1510. The integrated circuit design unit 1540 may be capable of determining the number of devices (e.g., processors, memory devices, etc.) to place in a device package, gate cut specifications, and other process specifications. The integrated circuit design unit 1540 may also determine the height of the fins, the size of the fin channels, size gate cut regions, any gate cut misalignment data, etc. Based upon such details of the devices, the integrated circuit design unit 1540 may determine specifications of the finFETs that are to be manufactured. Based upon these specifications, the integrated circuit design unit 1540 may provide data for manufacturing a semiconductor device in accordance with embodiments herein.

The system 1500 may be capable of performing analysis and manufacturing of various products involving various technologies. For example, the system 1500 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a plurality of fins on a semiconductor substrate;
   forming, over a portion of the fins, a gate region comprising a first dummy gate and a second dummy gate;
   forming, over the first dummy gate, a gate cut region; and
   depositing into the gate cut region, a conformal fill material, wherein depositing the conformal fill material into the gate cut region comprises forming a divot over an exposed position of the second dummy gate exposed by an offset of the gate cut region; and
   performing at least one subsequent processing step.

2. The method of claim 1, wherein forming the gate cut region over the first dummy gate comprises:
   depositing a gate cut liner;
   depositing an organic planarization layer (OPL) over the gate cut liner;
   forming a mask over the OPL;
   performing a gate cut patterning of the mask; and
   performing at least one removal process to remove a portion of the OPL and the gate cut liner in the gate cut region based on the gate cut patterning of the mask.

3. The method of claim 2, wherein:
   forming the mask comprises forming a mask comprising a photoresist material;
   performing the removal process comprises performing a photolithography process; and
   forming the plurality of fins comprises forming a set of NFET fins and a set of PFET fins.

4. The method of claim 1, wherein depositing the conformal fill material comprises depositing at least one of a conformal nitride material or a low-K dielectric material.

5. The method of claim 1, wherein performing at least one subsequent processing step comprises:
   removing the first dummy gate;
   replacing a void resulting from the removing of the first dummy gate with a dielectric material; and
   performing a replacement metal gate process on the second dummy gate.

6. The method of claim 1, further comprising:
   determining if a gate cut misalignment has occurred as a result of forming the gate cut region; and
   depositing, in response to a determination that a misalignment has occurred, the conformal fill material over an area associated with the misalignment for forming a divot in the area.

7. A method, comprising:
   forming a plurality of fins on a semiconductor substrate;
   forming, over a portion of the fins, a gate region comprising a first dummy gate and a second dummy gate;
   forming, over the first dummy gate, a gate cut region;
   depositing into the gate cut region, a conformal dielectric material, wherein the conformal fill material forms at least one divot in the gate region; and
   replacing the first dummy gate with a dielectric material.

8. The method of claim 7, wherein depositing the conformal dielectric material comprises forming the divot above a portion of the second dummy gate, and a pair of symmetrically divots adjacent the first dummy gate.

9. The method of claim 7, wherein depositing the conformal dielectric material comprises depositing at least one of a conformal nitride material or a low-K dielectric material.

10. The method of claim 7, wherein forming the gate cut region over the first dummy gate comprises:
    depositing a gate cut liner;
    depositing an organic planarization layer (OPL) over the gate cut liner;
    forming a mask over the OPL;
    performing a gate cut patterning of the mask; and
    performing at least one removal process to remove a portion of the OPL and the gate cut liner in the gate cut region based on the gate cut patterning of the mask.

11. The method of claim 10, wherein:
    forming the mask comprises forming a mask comprising a photoresist material; and
    performing the removal process comprises performing a photolithography process.

12. The method of claim 10, further comprising:
    determining if a gate cut misalignment has occurred as a result of forming the gate cut region; and
    depositing, in response to a determination that a misalignment has occurred, the conformal dielectric material over an area associated with the misalignment for forming a divot in the area.

* * * * *